(12) United States Patent
Park et al.

(10) Patent No.: US 6,396,084 B1
(45) Date of Patent: May 28, 2002

(54) STRUCTURE OF SEMICONDUCTOR RECTIFIER

(75) Inventors: Hyi-jeong Park; Hyun-soon Kang, both of Kyungki-do (KR)

(73) Assignee: Fairchild Korea Semiconductor LTD, Puchon (KR)

( * ) Notice: Subject to any disclaimer, the term of this patent is extended or adjusted under 35 U.S.C. 154(b) by 0 days.

(21) Appl. No.: 09/374,442

(22) Filed: Aug. 13, 1999

(30) Foreign Application Priority Data

Aug. 31, 1998 (KR) .............................. 98-35723

(51) Int. Cl.⁷ .................. H01L 29/28; H01L 23/00; H01L 29/87; H01L 29/74; H01L 29/72
(52) U.S. Cl. ................. 257/107; 257/109; 257/475; 257/487; 257/119; 257/126; 257/127; 257/131; 257/264; 257/175; 257/133; 257/121; 257/260
(58) Field of Search .................. 257/107, 112, 257/109, 110, 119, 121, 122–131, 355, 356, 360, 133, 138, 143, 212, 264, 378, 260, 175; 25/475, 487

(56) References Cited

U.S. PATENT DOCUMENTS

| | | |
|---|---|---|
| 4,811,070 A | 3/1989 | Hayashi et al. |
| 4,901,120 A | 2/1990 | Weaver et al. |
| 5,241,195 A | 8/1993 | Tu et al. .................. 252/155 |
| 5,344,794 A | 9/1994 | Whitney et al. |
| 5,602,404 A | 2/1997 | Chen et al. .................. 257/112 |
| 5,751,022 A | 5/1998 | Yasuhara et al. ............ 257/133 |
| 5,886,383 A | 3/1999 | Kinzer et al. ................ 257/341 |
| 5,917,216 A | 6/1999 | Floyd et al. ................. 257/330 |
| 6,069,371 A | 5/2000 | Omura et al. ................ 257/133 |
| 6,075,259 A | 6/2000 | Baliga ........................ 257/77 |

*Primary Examiner*—Alexander O. Williams
(74) *Attorney, Agent, or Firm*—Skjerven Morrill LLP; Philip W. Woo

(57) ABSTRACT

A semiconductor rectifier includes a substrate of a first conductivity type; a current path layer of the first conductivity type formed near the surface of the substrate; a current block layer of a second conductivity type laterally enclosing the current path layer and extending to a depth deeper than the current path layer; and first and second metal layers formed respectively contacting upper and lower surfaces of the substrate. The current path layer has an impurity concentration higher than that of the substrate, and the current block layer has an impurity concentration higher than that of the current path layer. The current path layer is small enough for the portion below the current path layer to be completely blocked by the depletion region formed around the current block layer when a reverse bias or no is applied to the rectifier. The current path layer and the current block layer can be formed in an epitaxial layer of the first conductivity type overlying a high-concentration substrate of the first conductivity type, and a buried layer of the second conductivity type below the current block layer can further reduce reverse bias current.

12 Claims, 6 Drawing Sheets

STRUCTURE OF SEMICONDUCTOR RECTIFIER

BACKGROUND OF THE INVENTION

1. Field of the Invention

The present invention relates to a semiconductor rectifier and a fabrication method thereof.

2. Description of the Related Art

Various methods have been suggested for fabricating a semiconductor rectifier having excellent rectification properties, i.e., a low voltage requirement for current in the forward direction and a minimal reverse current.

Figure 1:
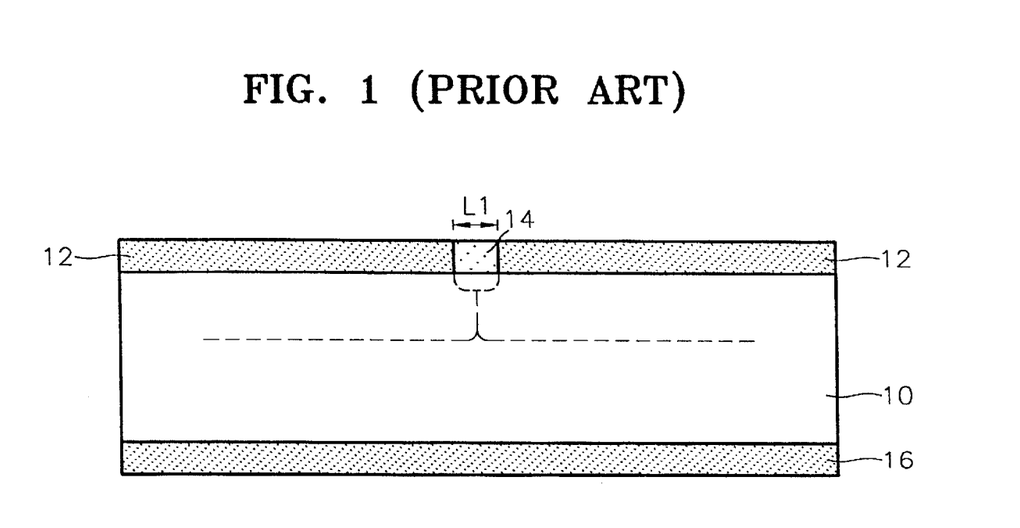
FIG. 1 is a sectional view of a conventional semiconductor rectifier in which a depletion region blocks current flow when a reverse bias is applied or bias is not applied.
Figure 2:
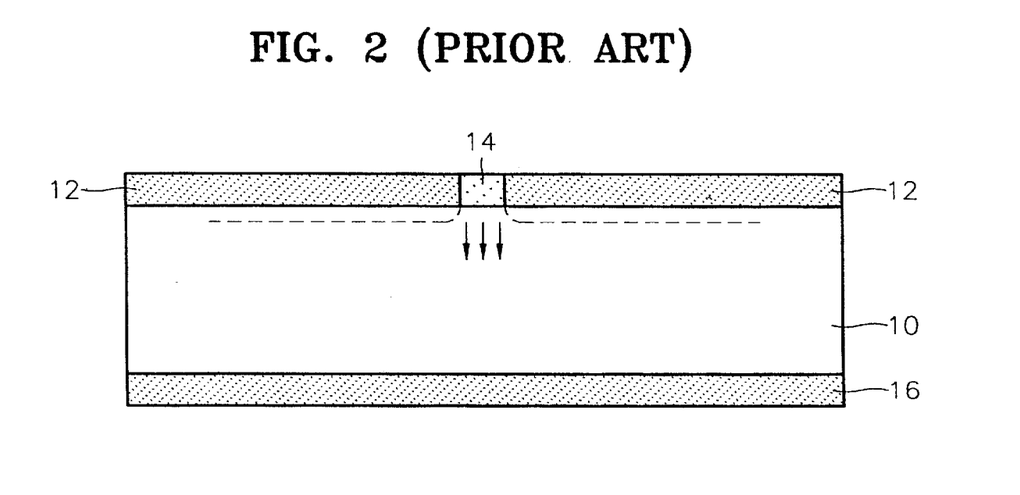
FIG. 2 is a sectional view of a conventional semiconductor rectifier showing the shape of a depletion region and a forward current flow when a forward bias is applied.

FIG. 1 is a sectional view of a conventional semiconductor rectifier in which an ohmic contact metal layer 14 and a Schottky contact metal layer 12 constitute an upper electrode of a rectifier formed in and on a substrate 10. An ohmic contact 16 forms the lower electrode of the rectifier. When a reverse bias or no bias is applied to the semiconductor rectifier, depletion regions shown by dashed lines in FIG. 1 block current flow between the upper and lower electrodes. FIG. 2 is a sectional view showing the shape of the depletion regions and a forward current flow when a forward bias is applied to the conventional semiconductor rectifier of FIG. 1. FIGS. 1 and 2 are based on U.S. Pat. No. 5,306,943 (Ariyhoshi et al.) which describes a method for improving rectification properties using a Schottky diode.

When a reverse bias or no bias is applied to the rectifier, the depletion regions extend into substrate 10 from the interface between Schottky contact metal layer 12 and substrate 10 as shown in FIG. 1. The depletion regions also extend laterally from below the Schottky contact metal layer 12 to below ohmic contact metal layer 14. As a result, the depletion regions block current from ohmic contact metal layer 14. Thus, a reverse current cannot flow between the electrodes on the surfaces of substrate 10.

When a forward bias is applied to the rectifier, as shown in FIG. 2, the depletion regions shrink. Accordingly, the depletion regions below Schottky contact metal layer 12 are shallower than in FIG. 1, and the depletion region extending below ohmic contact metal layer 14 is absent, resulting in a current path from ohmic contact metal layer 14. Thus, when a forward bias is applied, forward current (indicated by the arrows in FIG. 2) flows between ohmic contact metal layer 14 and ohmic electrode 16.

Also, the depletion region formed when a reverse bias or no bias is applied has a lateral width which is not greater than the longitudinal depth. That is, the depletion region extends at least as far in the longitudinal direction (into substrate 10) as in the lateral direction. Thus, to completely block the flow of the reverse current when a reverse bias or no bias is applied, width L1 of ohmic contact metal layer 14 must be small enough that the depletion regions extending in the lateral direction can completely block the current path from ohmic metal layer 14.

However, if ohmic contact metal layer 14 is too small, high forward voltage is required to remove the depletion region formed below the ohmic contact metal layer 14 and form a forward current path. Thus, a small ohmic contact metal layer 14 hinders forward current flow.

In view of the competing requirements, the size of ohmic contact metal layer 14 should be optimized to be small enough to prevent a reverse current and still large enough to allow current flow at a low forward voltage. In general, formation of ohmic contact metal layer 14 requires a fine photolithography technology because ohmic contact metal layer 14 is optimally about 0.5 µm.

The conventional rectifier described with reference to FIGS. 1 and 2 can use a Schottky diode to improve rectification properties. However, the Schottky contact metal layer and the ohmic contact metal layer require different materials that are parts of the same layer (upper electrode). This complicates the manufacturing process. Also, because fine photolithography is needed to create an ohmic contact of the optimal size, processing margins are small.

SUMMARY OF THE INVENTION

According to an aspect of the present invention, a semiconductor rectifier includes a substrate of a first conductivity type and a current path layer of a first conductivity type formed near the surface of the substrate. The current path layer has an impurity concentration higher than that of the substrate. A current block layer of a second conductivity type laterally encloses the current path layer and is deeper than the current path layer. The current block layer has an impurity concentration higher than that of the current path layer and a gap in a portion of the substrate below the current path layer. The current path layer is small enough for the portion below the current path layer to be completely blocked by the depletion region formed around the current block layer when a reverse bias or no is applied to the rectifier. For example, the size of the current path layer is equal to or less than about two times a lateral width of the depletion region. The current path layer has a plan view with a shape such as a circle, a hexagon or a bar.

First and second metal layers contact the upper and lower surfaces of the substrate, respectively, and form terminals of the rectifier. Both of the first and second metal layers may contain an ohmic contact material. Alternatively, the first metal layer contains a Schottky contact metal material, and the second metal layer contains an ohmic contact metal material.

According to an aspect of the present invention, a method for fabricating a semiconductor rectifier, includes forming a current path layer of a first conductivity type and a current block layer of a second conductivity type in a semiconductor substrate of the first conductivity type. The current path layer has an impurity concentration higher than that of the substrate and is near the surface of the substrate. The second conductivity type laterally encloses the current path layer and has a depth deeper than the depth of the current path layer. The impurity concentration of the current block layer is higher than the impurity concentration of the current path layer. For electrode formation, the method includes forming a first metal layer and a second metal layer on the substrate's upper and lower surfaces, respectively.

In one embodiment, forming the current path layer and the current block layer includes: (b1) implanting impurities of the first conductivity type with a high concentration near the surface of the substrate to form a first impurity layer; (b2) thermally processing the resulting structure to diffuse the impurities within the first impurity layer, resulting in formation of the current path layer; (b3) implanting impurities of the second conductivity type with a concentration higher than the current path layer, near the surface of the substrate to form a second impurity region; and (b4) thermally processing the resulting structure to diffuse the impurities within the second impurity layer, resulting in the current block layer enclosing the current path layer. Alternatively, forming the current path layer and the current block layer includes: (b1) implanting the impurities of the first conductivity type with a concentration higher than that of the substrate, near the surface of the substrate, to form a first impurity layer; (b2) implanting the impurities of the second conductivity type with a concentration higher than that of the first impurity layer, near the surface of the substrate to form a second impurity layer; and (b3) thermally processing the resulting structure to form the current path layer and the current block layer which is deeper than the current path layer and encloses the current path layer. With either method, the second impurity layer typically overlaps the first impurity layer, and the size of the resulting current path layer depends on lithography which defines the second impurity layer with portion not overlapping the first impurity layer and diffusion which narrows the non-overlapped portion down to the final size of the current path layer. Accordingly, a small current path layer can be achieved with good processing margins that are not dependent on fine photolithography procedures.

Preferably, the size of the current path layer is such that the portion below the current path layer is completely blocked by the depletion region formed around the current block layer when a reverse bias or no bias is applied to the rectifier. For example, the width of the current path layer exposed by the current block layer may be equal to or less than two times a lateral width of the depletion region formed enclosing the current block layer when a reverse bias or no bias is applied to the rectifier.

According to another embodiment of the present invention, a semiconductor rectifier includes: a high-concentration substrate of a first conductivity type; a low-concentration epitaxial layer of the first conductivity type, formed on the substrate; a current path layer of the first conductivity type, formed near the surface of the epitaxial layer and having an impurity concentration higher than the epitaxial layer; a current block layer of a second conductivity type, laterally enclosing the current path layer, the current block layer having an impurity concentration higher than the current path layer and a depth deeper than the current path layer; a buried layer of a second conductivity type, formed below the current block layer and near the interface between the substrate and the epitaxial layer, the buried layer having an impurity concentration higher than that of the current path layer; and first and second metal layers formed contacting the surface of the epitaxial layer and the lower surface of the substrate, respectively.

The size of the current path layer is typically such that the portion below the current path layer is completely blocked by the depletion region formed to enclose the current block layer when a reverse bias or no bias is applied to the rectifier. For example, the width of the current path layer is equal to or less than two times a lateral width of the depletion region. Also, the buried layer surrounds an area below the current path layer, and the depletion region around the buried layer completely blocks current flow through that area when a reverse bias or no bias is applied to the rectifier. For example, the surrounded area has a width that is equal to or less than two times a lateral width of the depletion region.

According to another aspect of the present invention, a method for fabricating a semiconductor rectifier includes: implanting impurities of a second conductivity type near the surface of a high-concentration substrate of a first conductivity type, to form a high-concentration buried layer; forming an epitaxial layer of the first conductivity type on the substrate, with a concentration lower than that of the substrate; forming a current path layer of the first conductivity type with a concentration higher than that of the epitaxial layer, near the surface of the epitaxial layer; forming a current block layer of the second conductivity type with an impurity concentration higher than that of the current path layer, which laterally encloses the current path layer and has a depth deeper than the current path layer; and forming a first metal layer and a second metal layer on the upper surface of the epitaxial layer and the lower surface of the substrate, respectively.

According to the present invention, a semiconductor rectifier has a low forward voltage drop, a low reverse current, and a simple manufacturing process that provides a large processing margin.

BRIEF DESCRIPTION OF THE DRAWINGS

The above features and advantages of the present invention will become more apparent by describing embodiments thereof with reference to the attached drawings in which.

DESCRIPTION OF THE PREFERRED EMBODIMENTS

Figure 3:
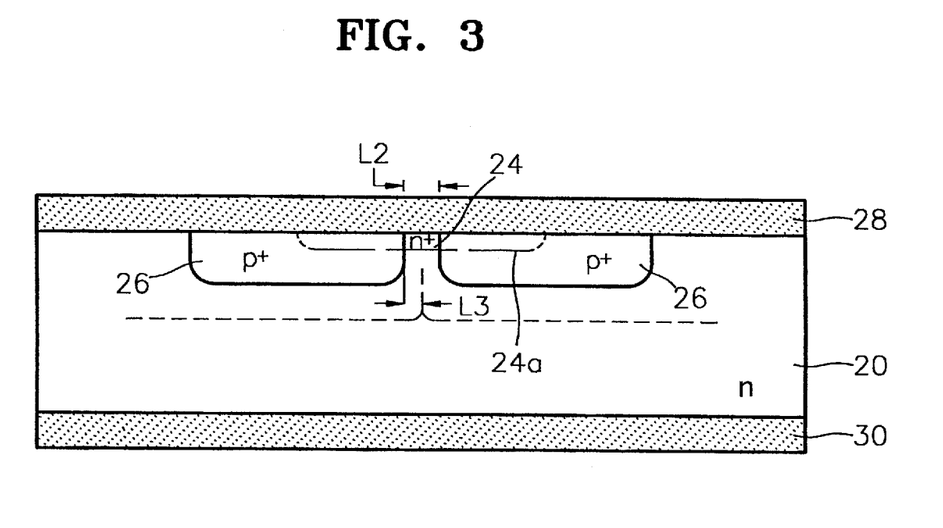
FIGS. 3 and 4 are sectional views of a semiconductor rectifier according to an embodiment of the present invention when a reverse or no bias is applied and when a forward bias is applied, respectively.
Figure 4:
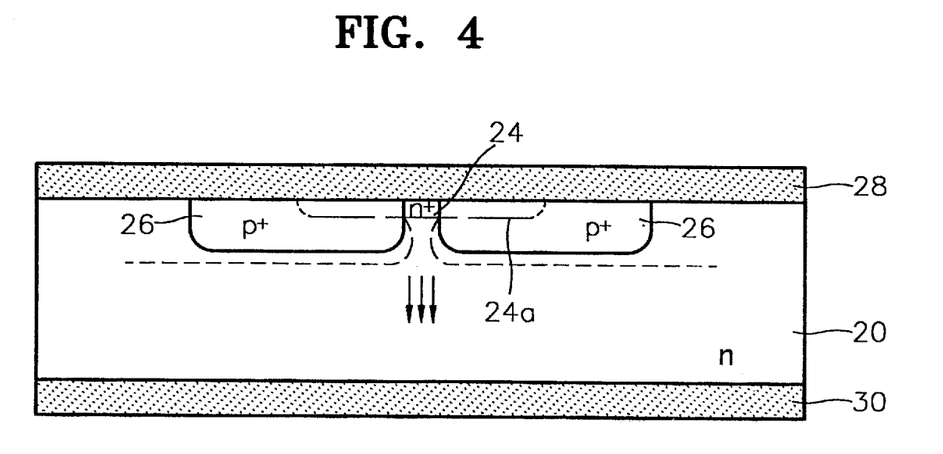

FIGS. 3 and 4 show a rectifier according to a first embodiment of the present invention. FIG. 3 shows the rectifier when a reverse or no bias is applied, and FIG. 4 shows the rectifier when a forward bias is applied. In FIG. 3, the semiconductor rectifier includes a semiconductor substrate 20 of a first conductivity type, a current path layer 24 of the first conductivity type, a current block layer 26 of a second conductivity type, and electrodes 28 and 30 contacting upper and lower surfaces of wafer 20. Current path layer 24 is near the surface of substrate 20 and has an impurity concentration higher than those of semiconductor substrate 20 and current path layer 24. Current block layer 26 laterally encloses current path layer 24 and extends deeper into substrate 20 than does current path layer 24.

Current path layer 24 has a width L2 such that a depletion region (indicated by dashed lines) completely encloses current path layer 24 when a reverse bias or no bias is applied to the rectifier. For example, the width L2 of current path layer 24 is equal to or less than twice the lateral width L3 of the depletion region around current block layer 26 when a reverse bias is applied or no bias is applied to the rectifier.

Referring to FIG. 3, a doped region 24a containing current path layer 24 partially overlaps current block layer 26. The non-overlapping portion of regions 24a is current path layer 24 and is part of an actual current path through which current flows when the rectifier is forward biased.

Current path layer 24 can have various shapes with geometrical plan views such as a circle, a hexagon, or a bar. Generally, the shape of current path layer must be such that the distance from any point within current path 24 to a nearest edge of current block layer 26 is less than or equal to the lateral extent of the depletion region from current block layer. Further, FIG. 3 shows only one current path layer 24. However, two or more structures each including a current path layer 24 surrounded by a current block layer 26 may be formed near the surface of substrate 20.

Electrode 28 is typically formed of single metal material, e.g., a metal that forms ohmic contact or Schottky contact with substrate 20. Electrode 30 is formed of a metal that forms ohmic contact with substrate 20. The rectifier shown in FIG. 3 may be implemented as a general rectifier or a Schottky rectifier depending on the material of electrode 28 and the conductivity type and impurity concentration of substrate 20.

In one exemplary embodiment of the invention, substrate 20 is an n-type silicon substrate having an impurity concentration of about $2 \times 10^{16}/cm^3$. Doped region 24a has a width of about 5 µm and is implanted with arsenic (As) to a concentration of about $1 \times 10^{18}/cm^3$ using an implantation energy of about 70 KeV to achieve a depth of about 1 µm. Current block layer 26 is doped with boron (B) to a concentration of about $1 \times 10^{19}/cm^3$ and a depth of about 1.5 µm. Current block layer 26 initially leaves a gap of about 2.5 µm where current path layer 24 retains n+ doping. After diffusion, current path layer 24 narrows to about 1 µm. Electrodes 28 and 30, which respectively contact the upper and lower surfaces of substrate 20, are aluminum (Al) and gold (Au), respectively. The materials and dimensions as described for this exemplary embodiment are only examples. Other embodiments can differ in dopant types and particular materials and dimensions.

When a reverse bias or no bias is applied, the depletion region (indicated by dashed lines in FIG. 3) extends from current block layer 26 in the lateral direction and in the longitudinal direction in substrate 20 and particularly extends below current path layer 24. As a result, the depletion region is below current path layer 24 and current block layer 26 and blocks reverse current flow.

When a forward bias is applied to the rectifier which has been in the state of FIG. 3, the width of the depletion region (indicated by dashed lines) decreases, so that the depletion region below current path layer 24 shrinks, opening a current path that allows current flow in the direction indicated by arrows in FIG. 4. Here, sufficient forward current can be obtained with a very low forward voltage because current path layer 24 has the same conductivity type as substrate 20 and impurity concentration higher than that of substrate 20.

Figure 5:
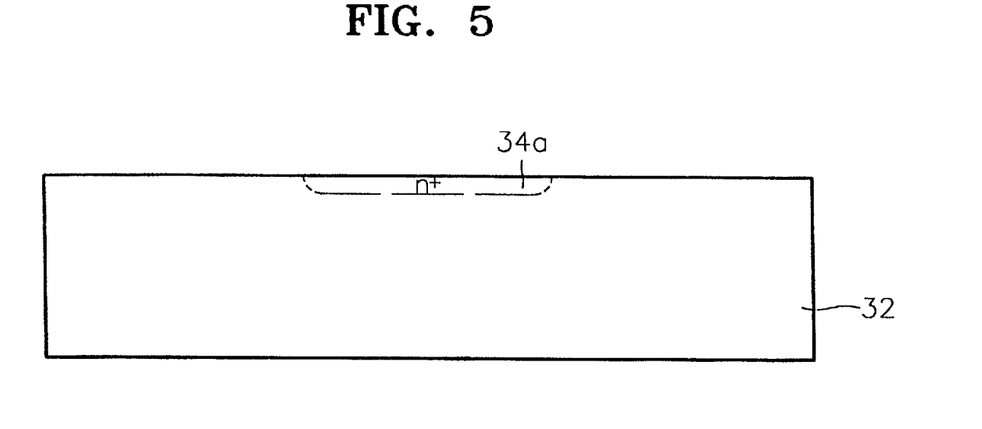
FIGS. 5 through 7 are sectional views illustrating a method for fabricating the semiconductor rectifier of FIGS. 3 and 4 according to an embodiment of the present invention.
Figure 6:
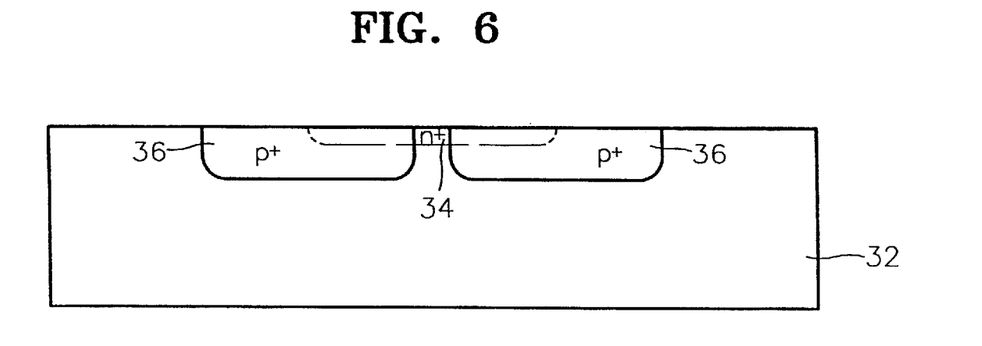
Figure 7:
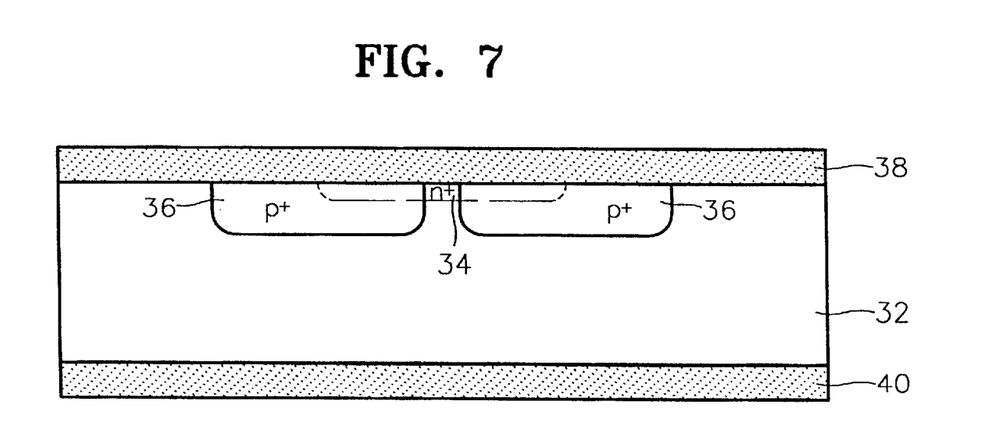

FIGS. 5 through 7 are sectional views illustrating a method for fabricating the semiconductor rectifier shown in FIGS. 3 and 4, according to a preferred embodiment of the present invention.

Referring to FIG. 5, after a substrate 32 of a first conductivity type is formed, impurities of the first conductivity type are implanted to a doped region 34a including a region in which a current path layer is to be formed. The concentration of impurities in doped 34a is higher than the impurity concentration in substrate 32. A thermal process diffuses the impurities within first doped region 34a to extend the boundaries of region 34a to those shown in FIG. 5. Here, region 34a shown in FIG. 5 is not used as a current path. Only the portion of region 34a that does not overlap a current block layer 36 (see FIG. 6) to be formed in a subsequent step, is used as a current path layer 34 (see FIG. 6).

In the conventional rectifier of FIG. 1, ohmic contact metal layer 14 is interposed in Schottky contact metal layer 12 to provide a current path, and ohmic contact metal layer 14 must be formed with the same size as that of the actual current path. Accordingly, manufacture of the conventional rectifier requires fine photolithography. In contrast the rectifier of FIG. 5 does nor require doped region 34a to have the same shape and size as current path layer 34 (see FIG. 6). Doped region 34a only needs to include the region in which current path layer 34 will be formed. Accordingly, the rectifier of FIG. 5 does not require the fine photolithography processes that the conventional rectifier requires.

Referring to FIG. 6, impurities of a second conductivity type are implanted into the structure of FIG. 5 in a region that surrounds current path layer 34. The concentration of the first conductivity type in doped region 34a. A thermal process diffuses the impurities resulting in formation of current block layer 36. Here, current block layer 36 is deeper than doped region 34a. More specifically, the interface between current block layer 36 and substrate 32 is below the interface between current path layer 34 and substrate 32.

The size of current path layer 34 is such that the depletion region enclosing current block layer 36 completely blocks the portion below current path layer 34 when a reverse bias or no bias is applied to the rectifier. That is, the width L2 (see FIG. 3) of current path layer 34 is equal to or less than twice the lateral width L3 (see FIG. 3) of the depletion region enclosing current block layer 36 when a reverse bias or no bias is applied to the rectifier.

The concentration of current block layer 36 and concentration of the substrate 32 determine the size and location of the depletion layer. Thus, the conditions of impurity implantation and diffusion when forming current block layer 36 and the impurity concentration in substrate 32 control the permitted dimensions of current path layer 34.

A combination of factors determines the size of current path layer 34. In particular, the width of current path layer 34 depends on both masked implantation and thermal diffusion processes that form current block layer 36. A photolithography process for the implantation of current block layer 36 can leave doped region 34a with a larger area not overlapped by current block layer 36. The thermal process then causes diffusion which narrows the non-overlapped portion of doped region 34a down to the desired size of current path layer 34. As a result, the processing margin is larger than in the conventional rectifier where photolithography alone limits size of ohmic contact metal layer 14 according to the lateral extension of the depletion layer.

Referring to FIG. 7, electrodes 38 and 40 are formed, contacting upper and lower surfaces of substrate 32. Each electrode 38 or 40 can be formed of a single material. For example, electrode 38 can be formed of a metal that forms ohmic contact or Schottky contact with substrate 32, and electrode 40 is formed of a metal forming ohmic contact with substrate 32.

Figure 8:
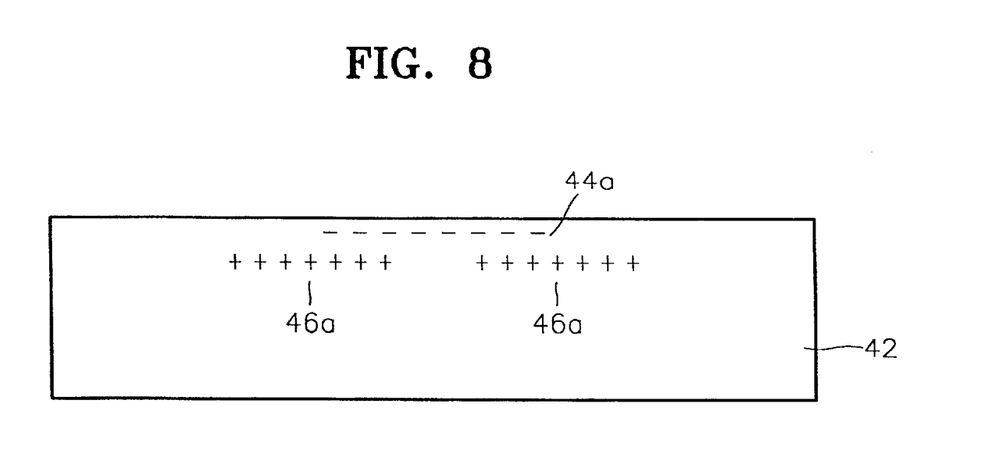
FIGS. 8 through 10 are sectional views illustrating a method for fabricating the semiconductor rectifier of FIGS. 3 and 4 according to another embodiment of the present invention.
Figure 9:
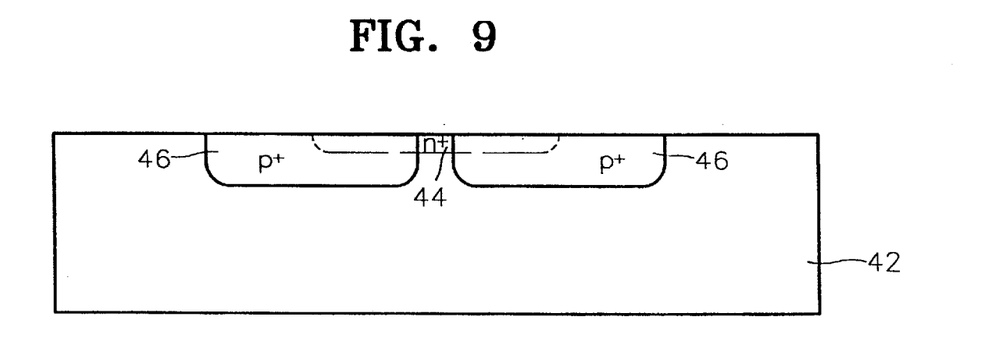
Figure 10:
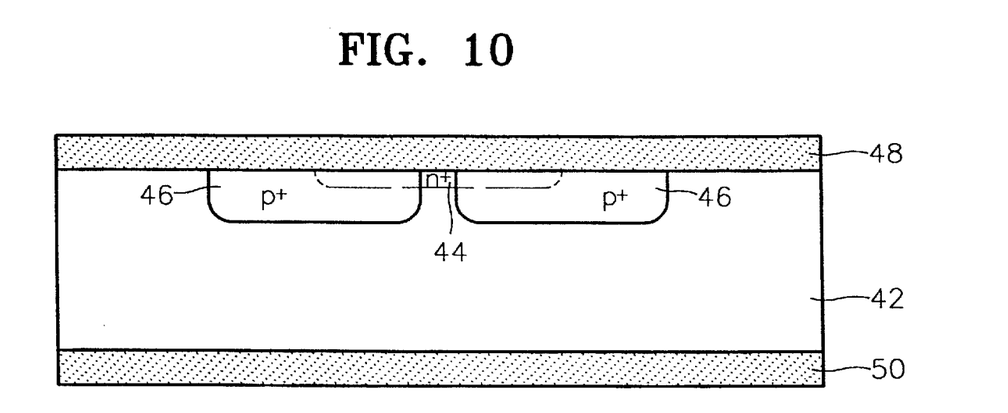

FIGS. 8 through 10 are sectional views illustrating step by step a method for fabricating the semiconductor rectifier shown in FIGS. 3 and 4, according to another embodiment of the present invention.

FIG. 8 shows impurities (−) of a first conductivity type in a substrate 42 of a first conductivity type. A concentration of the first conductivity type impurity that is higher than that of substrate 42 forms a first impurity layer 44a. Impurities of a second conductivity type are implanted with a concentration higher than that of the first impurity layer 44a, resulting in a second impurity layer 46b that partially overlaps first impurity layer 44a. Alternatively, the steps for forming first impurity layer 44a and second impurity layer 46b can be performed in reverse order.

Referring to FIG. 9, substrate 42 having the first and second impurity layers 44a and 46a is thermally processes to diffuse the impurities within the first and second impurity layers 44a and 46b, resulting in a current path layer 44 and a current block layer 46. The size and shape of current path layer 44 and current block layer 46 are the same as in the embodiment described with reference to FIGS. 5 and 6. Referring to FIG. 10, electrodes 48 and 50 are formed by the same process as described with reference to FIG. 7.

Figure 11:
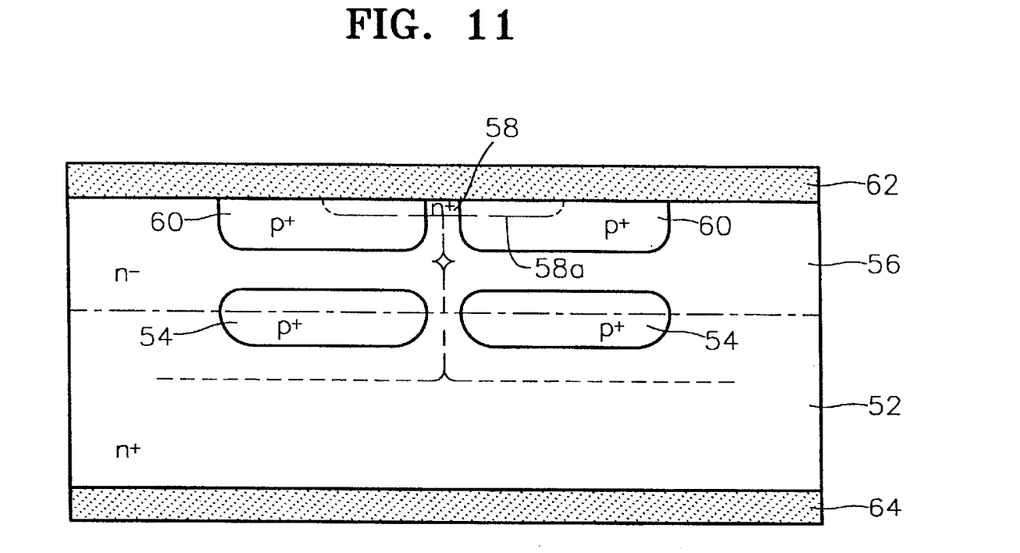
FIGS. 11 and 12 are sectional views of a semiconductor rectifier according to another embodiment of the present invention when a reverse or no bias is applied and when a forward bias is applied, respectively.
Figure 12:
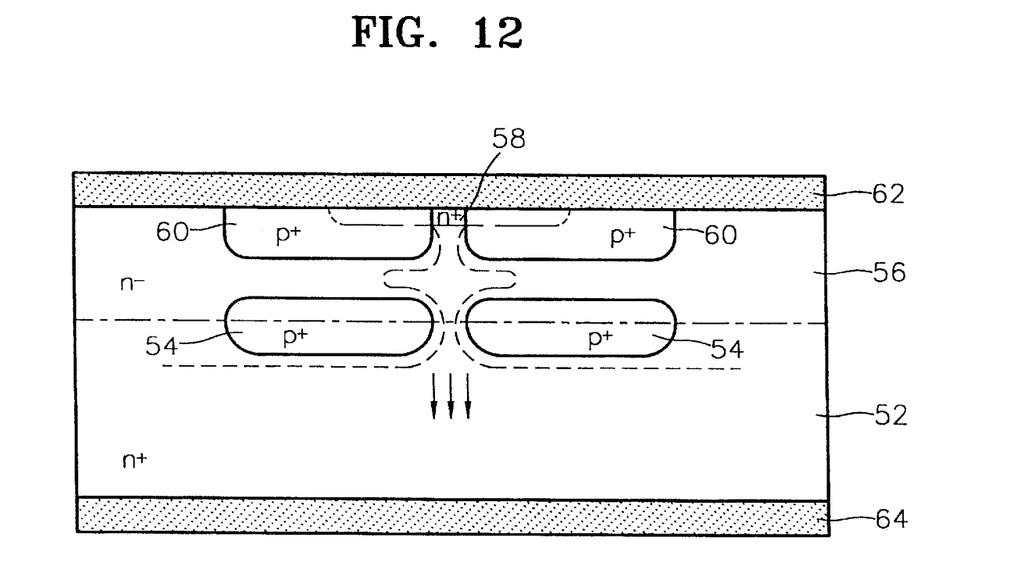

FIGS. 11 and 12 are sectional views showing a semiconductor rectifier according to another embodiment of the present invention. FIG. 11 shows the rectifier when a reverse bias or no bias is applied to the rectifier, and FIG. 12 shows the rectifier when a forward bias is applied to the rectifier.

Referring to FIG. 11, the rectifier includes a high-concentration substrate 52 of a first conductivity type and a low-concentration epitaxial layer 56 of the first conductivity type, formed on the substrate 52. A current path layer 58 of the first conductivity type, which has an impurity concentration higher than epitaxial layer 56 is formed near the surface of epitaxial layer 56. A current block layer 60 of a second conductivity type, which has an impurity concentration higher than that of current path layer 58 and a depth deeper than that of current path layer 58, laterally surrounds current path layer 58. Further, a buried layer 54 of the second conductivity type, which has an impurity concentration higher than that of the current path layer 58, is formed near the interface between substrate 52 and epitaxial layer 56 and is just below current block layer 60. Electrodes 62 and 64 respectively contact the upper surface of epitaxial layer 56 and the lower surface of substrate 52.

In the rectifier of FIG. 11, the geometrical structures and impurity concentrations of epitaxial layer 56, current path layer 58, and current block layer 60 are the same as the geometrical structures and impurity concentrations of substrate 20, current path layer 24, and current block layer 26 in the rectifier of FIG. 3 described above. In addition to the structure of FIG. 3, the rectifier of FIG. 11 further includes high-concentration substrate 52, and buried layer 54 which are just below current block layer 60 in the interface between substrate 52 and epitaxial layer 56.

Buried layer 54 has a plan view that laterally surrounds current path layer 58 and has a skipped area or gap under current path layer 58, as does current block layer 60. The size of buried layer 54 is such that a depletion region enclosing buried layer 54 completely blocks the area below current path layer 58 when a reverse bias or no bias is applied to the rectifier. For example, buried layer 54 surrounds an area with a width equal to or less than twice the lateral width of the depletion region. Additionally, the thickness of and impurity concentration of epitaxial layer 56 is such that the depletion region extends between current block layer 60 and buried layer 54.

As described with reference to FIG. 3, current path layer 58 can have various geometrical plan views such as a circle, a hexagon or a bar. Also, although FIG. 11 shows one current path layer 58, the rectifier may include more structures, each of which includes a current path layer 58 laterally surrounded by current block layer 60 an buried layer a 54.

Electrodes 62 and 64 are formed on epitaxial layer 56 and below substrate 52, with the same materials (e.g., metals) as described with reference to FIG. 3.

In one exemplary embodiment of the rectifier of FIG. 11, substrate 52 is an n-type silicon substrate having an impurity concentration of about $2 \times 10^{15}/cm^3$. Epitaxial layer 56 is about 12 μm thick and also has an impurity concentration of about $2 \times 10^{15}/cm^3$. Buried layer 54 is doped with a p-type dopant such as boron (B) to a concentration of about $1 \times 10^{19}/cm^3$ and a depth of about 2 μm in substrate 52. Current path layer 58a is a region about 5 μm wide that is implanted with an n-type dopant such as arsenic (As) to a concentration of about $1 \times 10^{18}/cm^3$ using an implantation energy of about 70 KeV to achieve a depth of about 1 μm. Current block layer 60 is doped with a p-type dopant such as boron (B), to a concentration of about $1 \times 10^{19}/cm^3$ and a depth of about 4.5 μm. Before diffusion, current block layer 60 overlaps part of current path layer 58a but leaves a gap of about 2.5 μm for current path layer 58. After diffusion, current path layer 58 narrows to about 1 μm or less and current block layer 60 and buried layer are separated by about 4.5 μm. Electrodes 62 and 64 are respectively aluminum and gold. The materials and dimensions as described for this exemplary embodiment are only examples. Other embodiments can differ in dopant types and particular materials and dimensions.

When a reverse bias or no bias is applied to the rectifier as shown in FIG. 11, the depletion region (indicated by dashed lines) grows from current block layer 60 into epitaxial layer 56 and simultaneously from buried layer 54 into substrate 52. The depletion region also extends laterally and downward from current block layer 60 in epitaxial layer 56, and the depletion region completely blocks the portion of epitaxial layer 56 below current path layer 58. Also, the depletion region surrounding buried layer 54 extends laterally and downward in substrate 52 as well as toward epitaxial layer 56 above buried layer 54, thereby blocking portions of epitaxial layer 56 and substrate 52 below current path layer 58. Thus, in the rectifier shown in FIG. 11, the portion below the current path layer 58 is blocked twice when a reverse bias is applied to the rectifier, thereby enhancing the blocking of reverse current.

When a forward bias is applied to the rectifier which had been in the state of FIG. 11, the width of the depletion region (indicated by dashed lines) decreases, so that the depletion region shrinks to open a current path allowing current flow in the direction indicated by arrows in FIG. 12. Here, current path layer 58, epitaxial layer 56, and substrate 52 have the same conductivity type, and sufficient forward current can be obtained with a very low forward voltage particularly when current path layer 58 has an impurity concentration higher than that of substrate 52 and substrate 52 has an impurity concentration higher than that of epitaxial layer 56.

Figure 13:
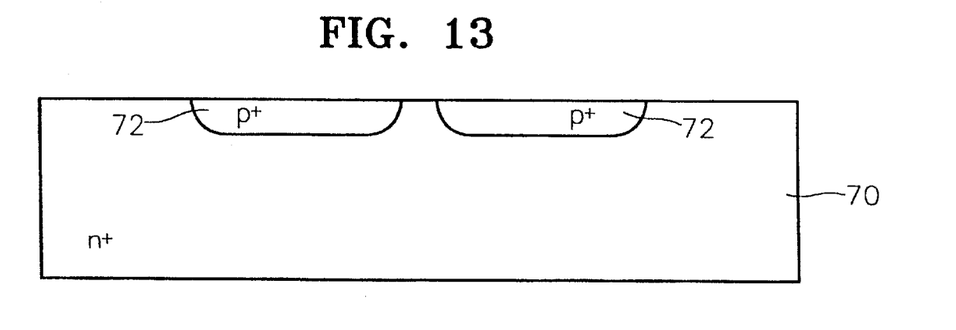
FIGS. 13 through 15 are sectional views illustrating a method for fabricating the semiconductor rectifier of FIGS. 11 and 12 according to another embodiment of the present invention.
Figure 14:
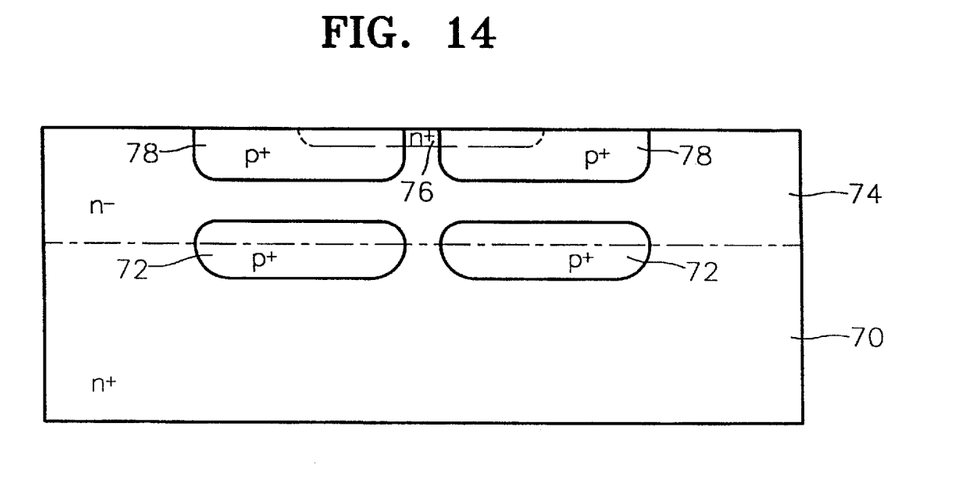
Figure 15:
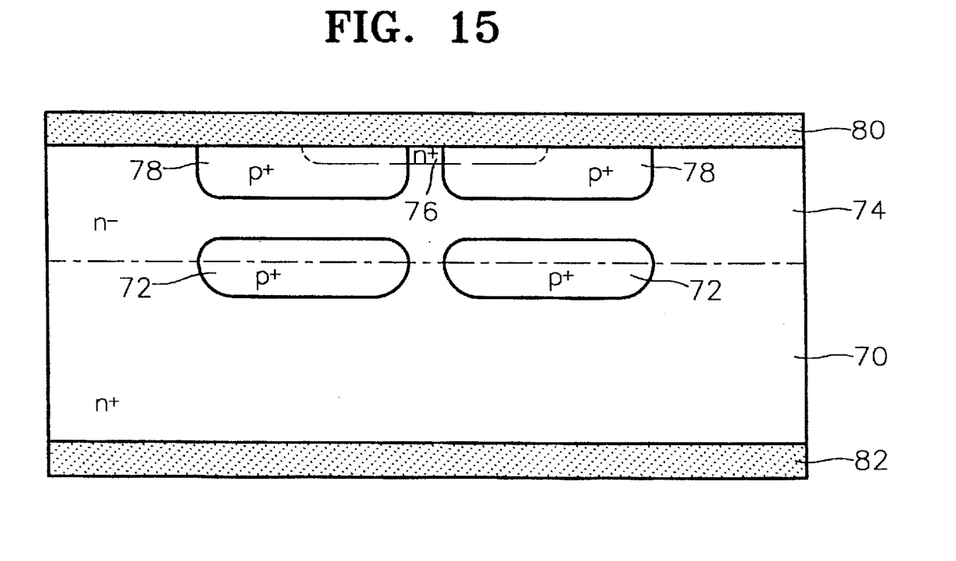

FIGS. 13 through 15 are sectional views illustrating a method for fabricating the semiconductor rectifier of FIGS. 11 and 12, according to an embodiment of the present invention.

Referring to FIG. 13, impurities of a second conductivity type are implanted with a high concentration, into a high-concentration substrate 70 of a first conductivity type, and then the resulting structure is thermally processes to form a buried layer 72 near the surface of substrate 70. Here, the concentration of the impurities of the second conductivity type is higher than the impurity concentration of a current path layer 76 (see FIG. 14) to be formed and higher than the impurity concentration of substrate 70.

Referring to FIG. 14, a low-concentration epitaxial layer 74 of a first conductivity type is formed on substrate 70 which contains buried layer 72. Then, current path layer 76 and current block layer 78 are formed near the surface of epitaxial layer 74. Here, current path layer 76 and current block layer 78 have the same structures and impurity concentrations as those described with reference to FIG. 11, and layers 76 and 78 are formed in the manner described with reference to the FIGS. 5 through 7 and/or FIGS. 8 through 10.

Referring to FIG. 15, an electrode 80 is formed on epitaxial layer 74, and an electrode 82 is formed below substrate 70. Electrodes 80 and 82 are formed of the same materials as electrodes 28 and 30 or 38 and 40 described with reference to FIGS. 3 and 7.

In an exemplary embodiment, the first conductivity type described above represents N-type, and the second conductivity type represents P-type. However, when the first and second conductivity types are P-type and N-type, respectively, the same effects as in the present invention illustrated above can be obtained. Also, a first conductivity type with a high concentration is conventionally referred to as $N^+$, the first conductivity type with a low concentration is conventionally referred to as $N^-$, and a second conductivity type with a high concentration is conventionally referred to as $P^+$. Also, the impurity concentration refers to the impurity concentration of the final structure.

As described above, in the rectifier and the fabrication method thereof according to the present invention, the current path layer and the current block layer are formed through the implantation of impurity ions, and diffusion thereof, so that a processing margin is enlarged. Also, each electrode can be formed of a single metal or material, so that the manufacturing is simpler than in the case that the method requiring formation of metal layers contain regions of different types of metals. Also, the rectifier has excellent properties, that is, the forward voltage drop and the reverse current are low.

While the present invention has been illustrated and described with reference to specific embodiments, further modifications and alterations within the spirit and scope of this invention as defined by the appended claims will occur to those skilled in the art.

What is claimed is:

1. A semiconductor rectifier comprising:
   a substrate of a first conductivity type;
   a current path layer of the first conductivity type formed near a first surface of the substrate, having an impurity concentration higher than that of the substrate; and
   a current block layer of a second conductivity type surrounding a periphery of the current path layer such that a bottom portion of the current path layer contacts the substrate, the current block layer having an impurity concentration higher than that of the current path layer and a depth deeper than that of the current path layer.

2. The semiconductor rectifier of claim 1, wherein the current path layer is small enough for a portion of the substrate below the current path layer to be completely blocked by the depletion region formed around the current block layer when a reverse bias or no bias is applied to the rectifier.

3. The semiconductor rectifier of claim 2, wherein the current path layer has a width that is equal to or less than two times a lateral width of the depletion region formed around the current block layer when no bias is applied to the rectifier.

4. The semiconductor rectifier of claim 1, further comprising:
   first metal layer contacting the first surface of the substrate; and
   a second metal layer contacting a second surface of the substrate.

5. The semiconductor rectifier of claim 4, wherein both of the first and second metal layers are formed of an ohmic contact material.

6. The semiconductor rectifier of claim 4, wherein the first metal layer is formed of a Schottky contact metal material, and the second metal layer is formed of an ohmic contact metal material.

7. A semiconductor rectifier comprising:
   a high-concentration substrate of a first conductivity type;
   a low-concentration epitaxial layer of the first conductivity type, formed on the substrate;
   a current path layer of the first conductivity type, formed near a first surface of the epitaxial layer, having an impurity concentration than that of the epitaxial layer;
   a current block layer of a second conductivity type, the current block layer surrounding a periphery of the current path layer, the current block layer having an impurity concentration higher that the impurity concentration of the current path layer and a depth deeper than that of the current path layer; and
   a buried layer of a second conductivity type, wherein the buried layer is below the current block layer and formed near an interface between the substrate and the epitaxial layer, the buried layer having an impurity concentration higher than that of the current path layer.

8. The semiconductor rectifier of claim 7, wherein the current path layer is small enough for a portion of the epitaxial layer below the current path layer to be completely blocked by a depletion region formed around the current block layer when a reverse bias or no bias is applied to the rectifier.

9. The semiconductor rectifier of claim 8, wherein a width of the current path layer is equal to or less than two times a lateral width of the depletion region formed around the current block layer when a reverse bias or no bias is applied to the rectifier.

10. The semiconductor rectifier of claim 9, wherein the buried layer surrounds a portion below the current path layer, and the portion is completely blocked by a depletion region formed to around the buried layer when a reverse bias or no bias is applied to the rectifier.

11. The semiconductor rectifier of claim 10, wherein the portion surrounded by the buried layer has a width that is equal to or less than two times a lateral width of the depletion region formed around the buried layer when a reverse bias or no bias is applied to the rectifier.

12. The semiconductor rectifier of claim 7, further comprising:
   a first metal layer contacting the first surface of the epitaxial layer; and
   a second metal layer contacting a second surface of the substrate.

* * * * *